(12) United States Patent
Tu et al.

(10) Patent No.: US 10,879,181 B2
(45) Date of Patent: Dec. 29, 2020

(54) EMBEDDED NON-VOLATILE MEMORY WITH SIDE WORD LINE

(71) Applicant: TAIWAN SEMICONDUCTOR MANUFACTURING CO., LTD., Hsinchu (TW)

(72) Inventors: Yung-Chun Tu, Kaohsiung (TW); Tsung-Yu Yang, Tainan (TW); Chung-Jen Huang, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/428,260

(22) Filed: Feb. 9, 2017

(65) Prior Publication Data
US 2018/0151586 A1 May 31, 2018

Related U.S. Application Data

(60) Provisional application No. 62/426,665, filed on Nov. 28, 2016.

(51) Int. Cl.
  *H01L 23/535* (2006.01)
  *H01L 29/792* (2006.01)
  *H01L 27/1157* (2017.01)
  *H01L 29/423* (2006.01)

(52) U.S. Cl.
  CPC ........ *H01L 23/535* (2013.01); *H01L 27/1157* (2013.01); *H01L 29/42344* (2013.01); *H01L 29/792* (2013.01)

(58) Field of Classification Search
  CPC ........ A01H 1/00; A01H 5/10; C12N 15/8285; C12C 1/6895; C12C 2600/13; C12C 2600/156; G11C 16/0416; G11C 16/10; H01L 21/28273; H01L 27/11521; H01L 29/7883; H01L 27/11568; H01L 23/535; H01L 27/1157; H01L 29/42344; H01L 29/792; C12Q 1/6895; C12Q 2600/13; C12Q 2600/156
  USPC ...... 257/324, 316; 365/185.2, 185.3, 185.23, 365/185.18
  See application file for complete search history.

(56) References Cited

U.S. PATENT DOCUMENTS

| | | | | |
|---|---|---|---|---|
| 7,579,243 B2* | 8/2009 | Kang | ..................... | B82Y 10/00 438/267 |
| 2004/0084710 A1* | 5/2004 | Baker, Jr. | ........... | G11C 16/0425 257/311 |
| 2005/0237777 A1* | 10/2005 | Hsieh | ................. | G11C 16/0475 365/63 |

(Continued)

*Primary Examiner* — Mohammed Shamsuzzaman
(74) *Attorney, Agent, or Firm* — McClure, Qualey & Rodack, LLP (57) ABSTRACT

A storage device includes a semiconductor substrate, a control gate, a word line, a dielectric layer, a charge storage nitride layer, and a blocking layer. The semiconductor substrate has a source region and a drain region. The control gate and a word line are disposed over the semiconductor substrate and located between the source and drain regions. The dielectric layer is in contact with the semiconductor substrate and disposed between the semiconductor substrate, the control gate, and the word line. The charge storage nitride layer is disposed between the dielectric layer and the control gate. The blocking layer is disposed between the charge storage nitride layer and the control gate.

20 Claims, 4 Drawing Sheets

(56) References Cited

U.S. PATENT DOCUMENTS

| | | | |
|---|---|---|---|
| 2006/0245246 A1* | 11/2006 | Lung | G11C 16/0475 365/185.3 |
| 2007/0218633 A1* | 9/2007 | Prinz | B82Y 10/00 438/267 |
| 2008/0291732 A1* | 11/2008 | Jenne | G11C 16/16 365/185.18 |
| 2009/0161439 A1* | 6/2009 | Aiika | G11C 16/0483 365/185.23 |
| 2009/0309153 A1* | 12/2009 | Yanagi | H01L 27/11568 257/324 |
| 2010/0259984 A1* | 10/2010 | Takeuchi | G11C 16/0475 365/185.15 |
| 2011/0070726 A1* | 3/2011 | Dickenscheid | H01L 29/66825 438/591 |
| 2012/0069651 A1* | 3/2012 | Lee | G11C 16/0416 365/185.2 |
| 2013/0084697 A1* | 4/2013 | Shen | H01L 21/28273 438/591 |
| 2014/0048867 A1* | 2/2014 | Toh | G11C 16/10 257/324 |
| 2015/0008509 A1* | 1/2015 | Charpin-Nicolle | H01L 29/42344 257/326 |
| 2015/0069490 A1* | 3/2015 | Yater | H01L 29/66825 257/316 |

* cited by examiner

EMBEDDED NON-VOLATILE MEMORY WITH SIDE WORD LINE

RELATED APPLICATIONS

This application claims priority to Provisional Application Ser. No. 62/426,665, filed on Nov. 28, 2016, the entire disclosure of which is incorporated herein by reference.

BACKGROUND

Power consumption and programming speed of flash memory devices are important issues as the portable electronic device has become increasingly popular in recent years. A conventional flash memory device has a memory array with a great number of memory units (i.e. memory cells). Each of the memory units is formed as a field-effect transistor including a floating gate and a control gate. The floating gate is configured to hold charges, and is fabricated on an oxide layer over an active region of a semiconductor substrate. The floating gate is separated from the source/drain regions in the semiconductor substrate by the oxide layer. Each memory cell may be programmed or electrically charged by injecting electrons into the floating gate from the substrate through the oxide layer. The charges can be removed from the floating gate during an erase operation. The data in each of the memory cells may be judged by the charges accumulated in the floating gate. However, conventional flash memory devices have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present disclosure relates generally to a storage device such as for example SONOS (silicon-oxide-nitride-oxide-silicon) embedded flash memory devices. Conventional flash memory devices suffer "over erase" issues. The "over erase" issue refers to the channel region of the flash memory cell to be unfavorably transformed into a conductive state during an erase operation on the flash memory device. During the erase operation, the trapped charges are released and injected to the semiconductor substrate. When the charges accumulate in the channel region, the channel region is unfavorably turned on. According to some aspects of the present disclosure, the storage device disclosed herein may resolve the "over erase" issue. Various embodiments of the present disclosure will be described in detail hereinafter.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
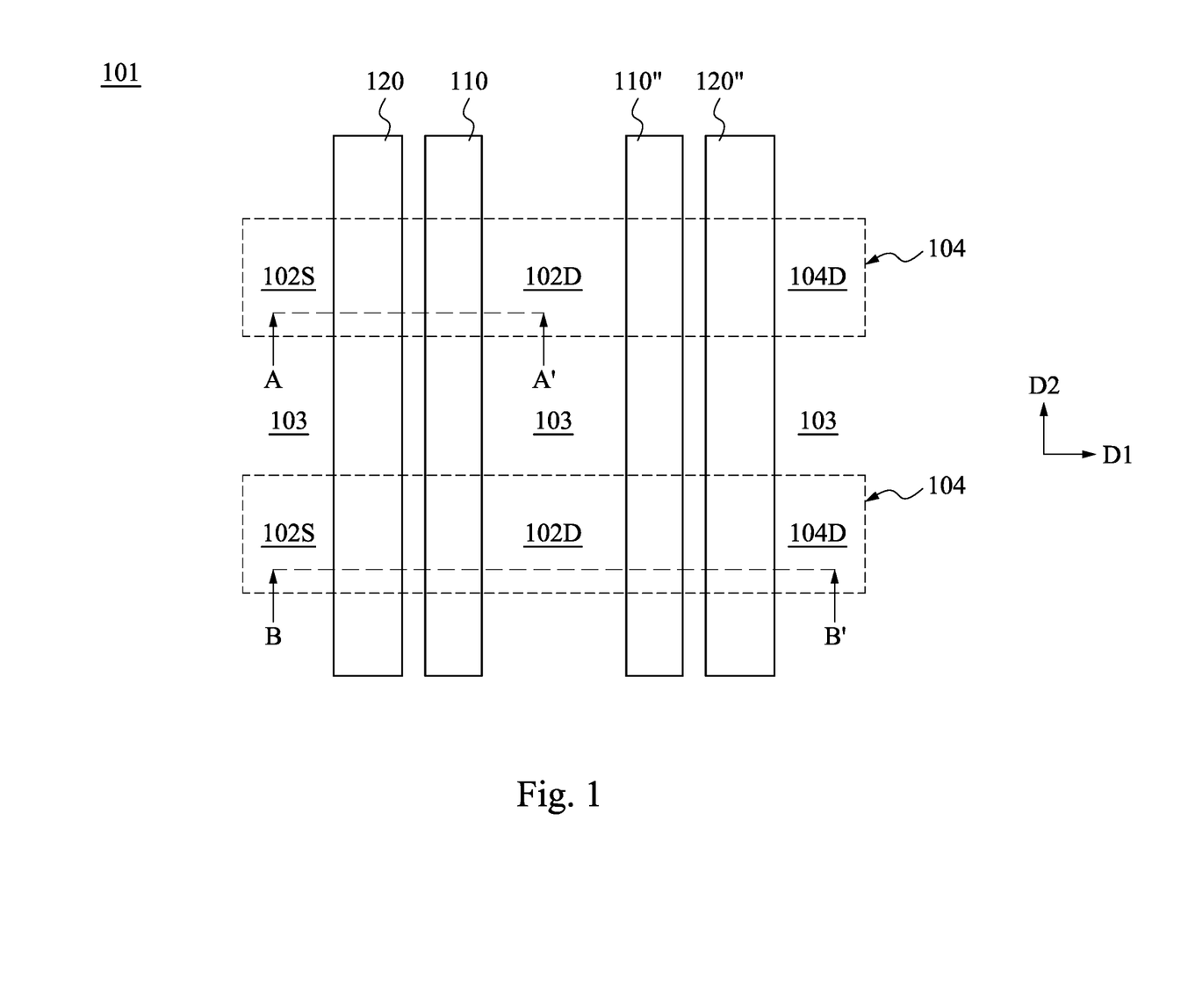
FIG. 1 is a plan view schematically illustrating a storage device according to various embodiments of the present disclosure.
Figure 2:
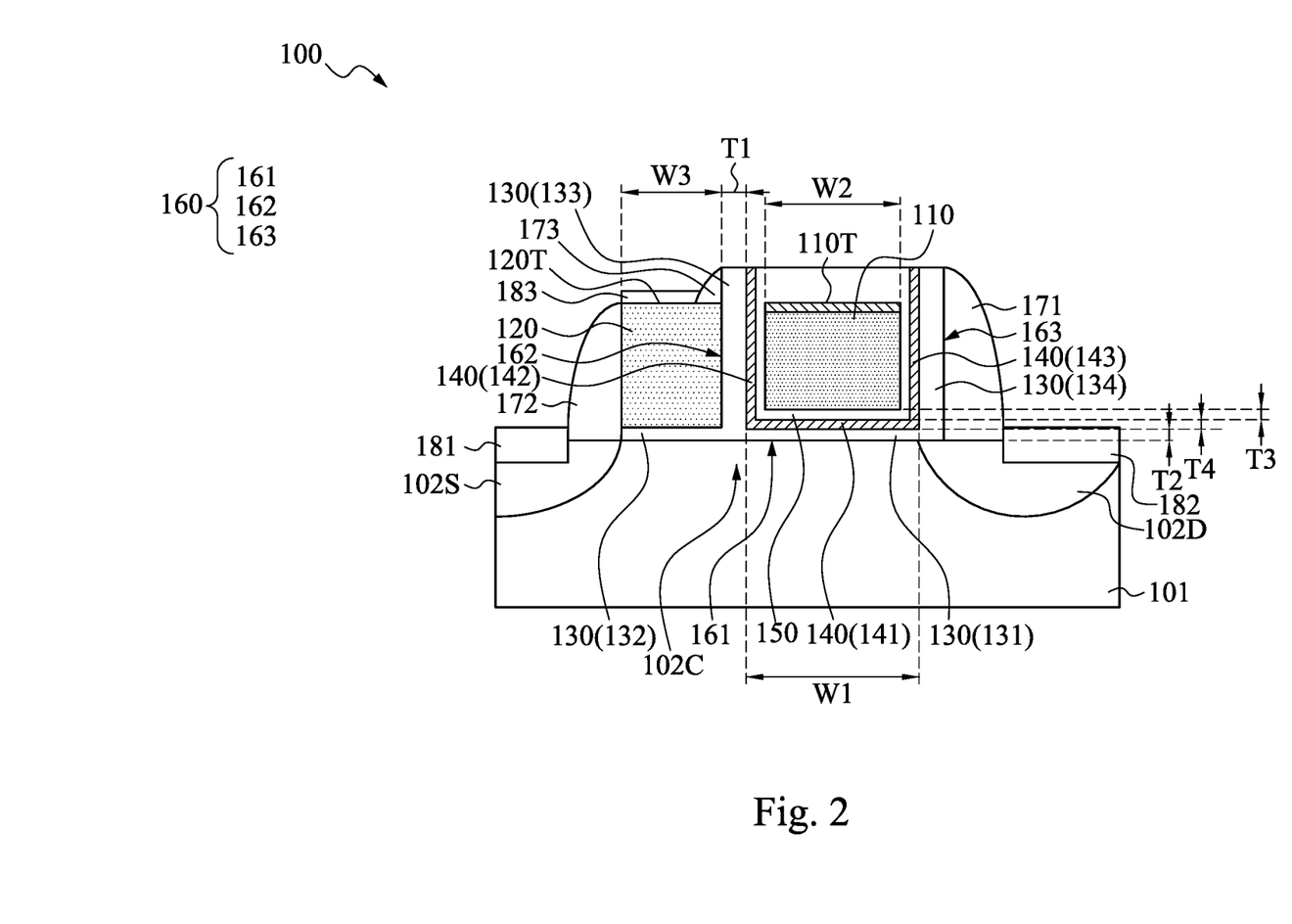
FIG. 2 is a cross-sectional view schematically illustrating a storage device according to some embodiments of the present disclosure.

FIG. 1 is a plan view schematically illustrating a storage device 100 according to various embodiments of the present disclosure. FIG. 2 is a cross-sectional view schematically illustrating a storage device 100 according to some embodiments of the present disclosure, that is approximately taken along line A-A' of FIG. 1. As shown in FIGS. 1 and 2, the storage device 100 includes a semiconductor substrate 101, a control gate 110, a dielectric layer 130, a charge storage nitride layer 140, and a blocking layer 150.

The semiconductor substrate 101 includes a source/drain region 102S and a source/drain region 102D. In some embodiments, the semiconductor substrate 101 includes an active region 104, and the source/drain region 102S and source/drain region 102D are formed in the active region 104, as shown in FIG. 1. Further, a channel region 102C (shown in FIG. 2) may be formed between the source/drain regions 102S and 102D. In some examples, the active region 114 includes a stripe pattern in a top view or plane view, and extends in a direction D1. In some examples, the source/drain region 102S and source/drain region 102D may be N+ region or P+ region formed by suitable processes such as for example implantation techniques. In some examples, at least one of the source/drain region 102S and source/drain region 102D is formed first by an implantation process, and followed by a high temperature drive-in cycle to provide a desired source/drain profile.

In some embodiments, the semiconductor substrate 101 further includes a shallow trench isolation (STI) region 103 that surrounds the active region 104 in a plan view, as illustrated in FIG. 1.

The semiconductor substrate 101, for example, may include silicon. In some embodiments, the semiconductor substrate 101 may include other elementary semiconductor such as for example germanium. In yet some embodiments, the semiconductor substrate 101 may include an alloy semiconductor such as for example silicon germanium, silicon germanium carbide, gallium indium phosphide and the like. In yet some embodiments, the semiconductor substrate 101 may include compound semiconductor such as gallium arsenic, silicon carbide, indium phosphide, indium arsenide and the like. Further, the semiconductor substrate 101 may optionally include a semiconductor-on-insulator (SOI) structure.

The control gate 110 is disposed over the semiconductor substrate 101, and is located between the source/drain region 102S and source/drain region 102D. In some embodiments, the control gate 110 crosses over the active region 104, as shown in FIG. 1. In some examples, the control gate 110 may include a stripe pattern in a top view or a plane view, and extends in a direction D2. The direction D2 is different from the direction D1 such that the control gate 110 intersects the active region 104. For example, the direction D2 may be substantially perpendicular to the direction D1 so that the control gate 110 is overlapped with the channel region 102C between the source/drain region 102S and the source/drain region 102D.

In some embodiments, the control gate 110 may include polycrystalline silicon. It is noted that other conductive materials may also be employed to form control gate 110. When the control gate 110 is formed of polycrystalline silicon, it may be implanted with an n-type or a p-type impurity, followed by an annealing process to activate the implanted impurity.

The word line 120 is disposed over the semiconductor substrate 101, and is located between the source/drain region 102S and the source/drain region 102D. In some embodiments, the word line 120 crosses over the active region 104, as shown in FIG. 1. In some examples, the word line 120 extends in the direction D2 so that the word line 120 is substantially parallel to the control gate 110. For example, the word line 120 may include a stripe pattern in a top view or a plane view. In yet some embodiments, the word line 120 is arranged adjacent to the source/drain region 102S so that the word line 120 is between the control gate 110 and the source/drain region 102S. Further, the control gate 110 is arranged adjacent to the source/drain region 102D such that the control gate 110 is between the word line 120 and the source/drain region 102D. In yet some embodiments, the top 120T of the word line 120 is at a level higher than the top 110T of the control gate 110 so that the manufacturing process has a wide process window and an excellent yield. In examples, the thickness of the word line 120 is greater than the thickness of the control gate. In yet some embodiments, the word line 120 may include polycrystalline silicon. It is noted that other conductive materials may also be employed to form the word line 120. When the word line 120 is formed of polycrystalline silicon, it may be implanted with an n-type or a p-type impurity, followed by an annealing process to activate the implanted impurity.

The dielectric layer 130 is disposed on and in contact with the semiconductor substrate 101, as shown in FIG. 2. The dielectric layer 130 is located between the semiconductor substrate 101, the control gate 110, and the word line 120. In various embodiments, the dielectric layer 130 is a tunneling dielectric layer such as a for example a tunneling oxide layer. In some examples, the dielectric layer 130 may include silicon oxide or consists essentially of silicon oxide.

In yet some embodiments, the dielectric layer 130 includes a first portion 131, a second portion 132, and a third portion 133. The first portion 131 is interposed between the control gate 110 and the semiconductor substrate 101. The second portion 132 is laterally extends from an edge of the first portion 131, and is interposed between the word line 120 and the semiconductor substrate 101. In addition, the third portion 133 is interposed between the control gate 110 and the word line 120. The third portion 133 extends upwards from a junction of the first portion 131 and second portion 132 such that the word line 120 is insulated from the control gate 110. In some examples, the third portion 133 extends past a top 110T of the control gate 110 and/or a top 120T of the word line 120T. In yet some examples, the third portion 133 of the dielectric layer 130 has a thickness T1 that is greater than a thickness T2 of the first portion 131.

In yet some embodiments, the dielectric layer 130 further includes a fourth portion 134 extending upwards from an edge of the first portion 131. The fourth portion 134 and the third portion 133 are arranged at opposite sides of the control gate 110.

The charge storage nitride layer 140 is disposed between the dielectric layer 130 and the control gate 110. In some embodiments, the charge storage nitride layer 140 includes a first portion 141, a second portion 142, and a third portion 143. The first portion 141 of the charge storage nitride layer 140 is under the control gate 110. The second portion 142 and third portion 143 of the charge storage nitride layer 140 extend upwards from opposite sides of the first portion 141 such that the second portion 142 and third portion 143 are located at opposite sides of the control gate 110. Specifically, the second portion 142 of the charge storage nitride layer 140 may extend upwards between the control gate 110 and the word line 120. In some examples, the second portion 142 and third portion 143 of the charge storage nitride layer 140 extends past the top 110T of the control gate 110 and/or the top 120T of the word line 120T. In yet some examples, the first portion 141 of the charge storage nitride layer 140 has a width W1 that is greater than a width W2 of the control gate 110. In some examples, the charge storage nitride layer 140 may include silicon nitride or consists essentially of silicon nitride.

The blocking layer 150 is arranged between the charge storage nitride layer 140 and the control gate 110. In some embodiments, the blocking layer 150 is interposed between and in direct contact with the control gate 110 and charge storage nitride layer 140. In yet some embodiments, the charge storage nitride layer 140 is interposed between and in direct contact with the dielectric layer 130 and the blocking layer 150. In yet some embodiments, the blocking layer 150 wraps the bottom surface and the side surfaces of the control gate 110. In some examples, the blocking layer 150 includes silicon oxide or consists essentially of silicon oxide.

In some embodiments, the blocking layer 150 includes silicon oxide, and has a thickness T3 that is approximately 20-50% of a thickness T4 of the charge storage nitride layer 140. For example, the thickness T3 of the blocking layer 150 may be approximately 25%, 30%, 35%, 40%, or 45% of the thickness T4 of the charge storage nitride layer 140. Stated differently, the thickness T4 of the charge storage nitride layer 140 is approximately 2-5 folds of the thickness T3 of the blocking layer 150.

In some embodiments, the dielectric layer 130 includes silicon oxide, and has a thickness T2 that is approximately 5-30% of a thickness T4 of the charge storage nitride layer 140. For example, the thickness T2 of the dielectric layer 130 may be approximately 10%, 15%, 20%, or 25% of the thickness T4 of the charge storage nitride layer 140. Stated differently, the thickness T4 of the charge storage nitride layer 140 is approximately 3-20 folds of the thickness T2 of the dielectric layer 130.

In yet some embodiments, the dielectric layer 130 and the blocking layer 150 includes oxide, and the thickness T2 of the dielectric layer 130 is approximately 20-70% of the thickness T3 of the blocking layer 150.

The thickness relationships between the dielectric layer 130, charge storage nitride layer 140, blocking layer 150 affect the performance of the storage device 100 according to some embodiments of the present disclosure. In some embodiments, when certain thickness ratio(s) is/are out of the range described above, several problems occur. For example, the charges may not be storied appropriately in the charge storage nitride layer 140, and/or the charges may not tunnel the dielectric layer 130 to reach the charge storage nitride layer 140, and/or the blocking layer 150 may not prevent the charges from migration to the control gate 110.

According to some examples of the present disclosure, the thickness T2 of the dielectric layer 130 may be approximately 5-30 angstrom (A), specifically approximately 10-25 A, more specifically approximately 15-20 A. In yet some examples, the thickness T4 of the charge storage nitride layer 140 is approximately 80-150 angstrom (A), specifically approximately 95-135 A, more specifically approximately 110-120 A. In yet some examples, the thickness T3 of the blocking layer 150 is approximately 20-60 angstrom (A), specifically approximately 25-50 A, more specifically approximately 35-40 A.

In some embodiments, the dielectric layer 130 includes a major component of silicon oxide, the charge storage nitride layer 140 includes a major component of silicon nitride, and the blocking layer 150 includes a major component of silicon oxide. Therefore, the dielectric layer 130, the charge storage nitride layer 140 and the blocking layer 150 constitute collectively an oxide-nitride-oxide structure 160.

In some embodiments, the oxide-nitride-oxide structure 160 includes a first portion 161 interposed between the control gate 110 and the semiconductor substrate 101 and a second portion 162 interposed between the control gate 110 and the word line 120. In yet some embodiments, the oxide-nitride-oxide structure 160 further includes a third portion 163. The third portion 163 and the second portion 162 are positioned at opposite sides of the control gate 110. In some examples, the second portion 162 and/or the third portion 163 extend upwards from opposite sides of the first portion 161 of the oxide-nitride-oxide structure 160. Further, the second portion 162 extends past the top 120T of the word line 120 by a distance, and the distance is approximately 10-30% of the height of the word line 120, specifically approximately 15-25%.

The storage device 100 may optionally include a spacer 171, a spacer 172, and a spacer 173. The spacer 171 is adjacent to the third portion 163 of the oxide-nitride-oxide structure 160, and further covers a lateral surface of the third portion 163. The spacer 172 is adjacent to the word line 120, and further covers a lateral surface of the word line 120. The spacer 173 is disposed on the top 120T of the word line 120 and adjoins the second portion 162 of the oxide-nitride-oxide structure 160.

The storage device 100 may optionally include a silicide 181, a silicide 182, and a silicide 183. The silicide 181 is formed on a surface of the source/drain region 102S. The silicide 182 is formed on a surface of the source/drain region 102D. The silicide 183 is formed on the top 120T of the word line 120.

Figure 3:
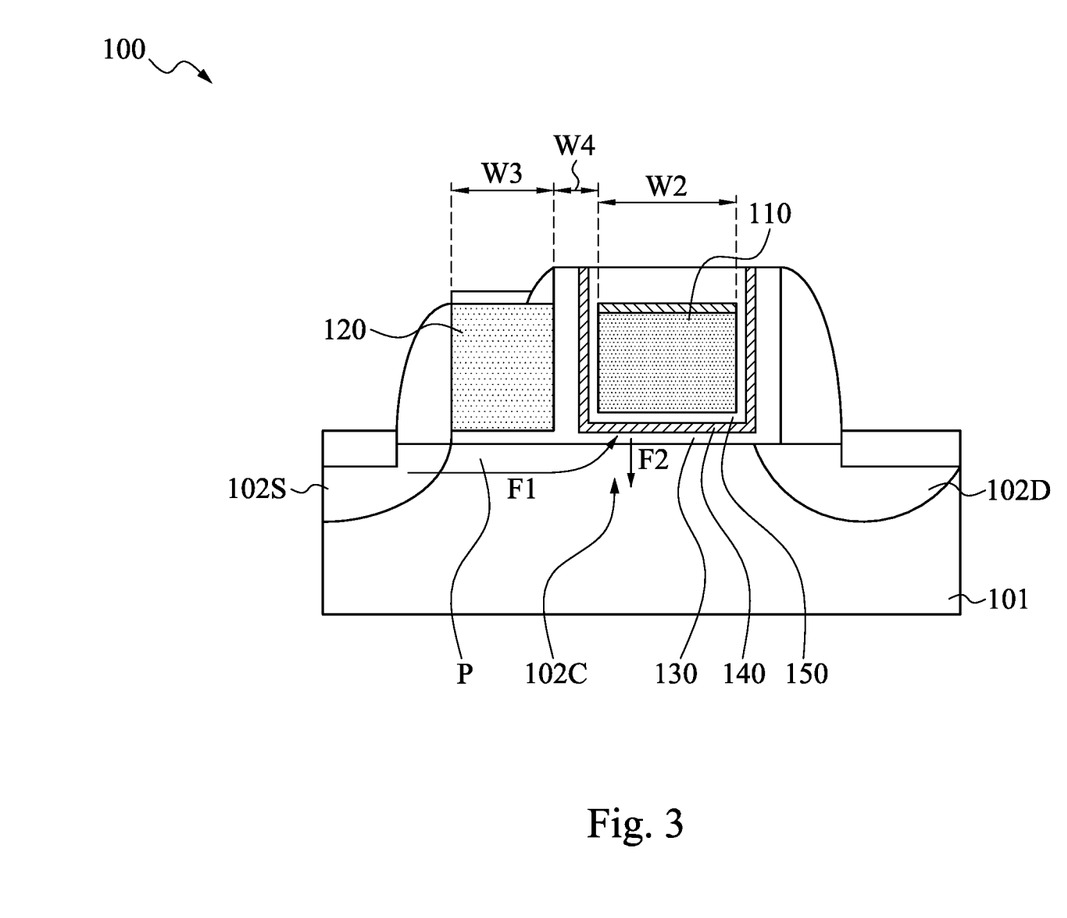
FIG. 3 is drawing schematically illustrating the migration of charges in the storage device according to some embodiments of the present disclosure.

FIG. 3 is drawing schematically illustrating the migration of charges in the storage device 100 according to some embodiments of the present disclosure. During a program operation on the storage device 100, a first voltage is applied to the control gate 110 so as to promote the migration of charges from the source/drain region 102S toward the control gate 110 (as illustrated by arrow F1). For example, a positive bias voltage may be applied to the control gate 110 and a negative bias voltage may be applied to the semiconductor substrate 101 (or the source/drain region 102S) so that the charges such as electrons migrate from the source/drain region 102S to the charge storage nitride layer 140. The charges, tunneling through the dielectric layer 130, arrives the charge storage nitride layer 140 and are stored in the charge storage nitride layer 140. According to some embodiments of the present disclosure, the injection of charges to the charge storage nitride layer 140 is hot-electron injection.

In some embodiments, a second voltage may be further applied to the word line 120 during the program operation. In examples, when the first voltage of the control gate 110 is a positive bias voltage, the applied second voltage is also a positive bias voltage but less than the first voltage. Therefore, the charges migrate from the source/drain region 102S to a position P under the word line 120, and then migrate from the position P under the word line 120 to the control gate 110. The charges tunnel through the dielectric layer 130, reaching the charge storage nitride layer 140, and are stored or trapped in the charge storage nitride layer 140. Accordingly, a fast programming speed may be achieved due to the arrangement of the word line, and the storage device therefore may be advantageous in high efficiency of charge injection and low power consumption.

During an erase operation on the storage device 100, a reversed bias voltage may be applied across the control gate 110 and the semiconductor substrate 101 according to some embodiments of the present disclosure. For example, a negative bias voltage may be applied to the control gate 110 whereas a positive bias voltage may be applied to the semiconductor substrate 101. The voltage across the control gate 110 and the semiconductor substrate 101 promotes the charges trapped in the charge storage nitride layer 140 to tunnel through the dielectric layer 130, moving to the channel region 102C of the semiconductor substrate 101 (as illustrated by arrow F2). As a result of the tunneling, the charge storage nitride layer 140 is erased. In some embodiments, releasing the trapped charges to the semiconductor substrate 101 is Fowler-Nordheim injection.

According to some embodiments of the present disclosure, the control gate 110 is distanced from the source/drain region 102S because the word line 120 and the second portion 162 of the oxide-nitride-oxide structure 160 are arranged between the source/drain region 102S and the control gate 110. The released charges in the channel region 102C may be kept at a relatively far distance from the source/drain region 102S. The released charges occupy only a portion of the channel region 102C so that the channel region 102C is maintained in a non-conductive state, and the problem of "over erase" may be resolved. The distance between the released charges and the channel region 102C is influenced by the width W3 of the word line 120 and the width W4 of the second portion 162 of the oxide-nitride-oxide structure 160.

During the erase operation, the word line 120 may be applied with a negative bias voltage to prevent the released charges from migration to the source/drain region 102S according to some embodiments of the present disclosure. However, in yet some embodiments, the word line 120 may be grounded or floating.

According to some embodiments of the present disclosure, the erase operation is relevant to the width W2 of the control gate 110, the width W3 of the word line 120, and the width W4 of the second portion 162 of the oxide-nitride-oxide structure 160, as discussed above. In some embodiments, the width W3 of the word line 120 is approximately 50-150% of the width W2 of the control gate 110 in order to have a reliable erase operation. For example, the width W3 of the word line 120 may be approximately 60%, 70%, 80%, 90%, 100%, 110%, 120%, 130%, or 140% of the width W2 of the control gate 110. In yet some embodiments, the width W4 of the second portion 162 of the oxide-nitride-oxide structure 160 is approximately 23-43% of the width W2 of the control gate 110 in order to have a reliable erase operation. For example, the width W4 of the second portion 162 may be approximately 25%, 28%, 31%, 33%, 35%, 38%, or 40% of the width W2 of the control gate 110.

Several embodiments of the present disclosure are described in detail hereinbefore. The storage device 100 is free of any of erase gates, floating gates and select gates according to some embodiments of the present disclosure.

Figure 4:
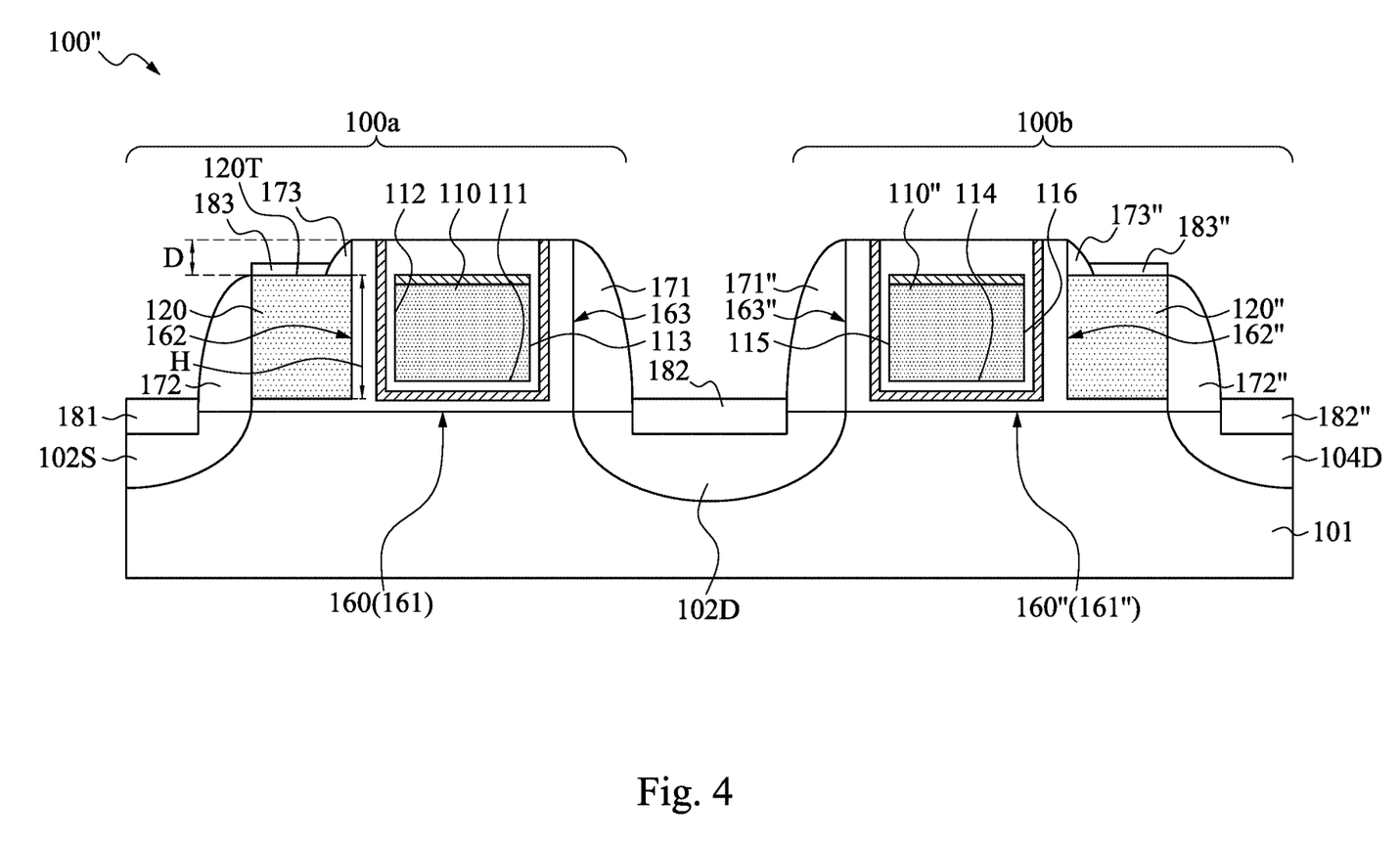
FIG. 4 is a cross-sectional view schematically illustrating a storage device according to yet some embodiments of the present disclosure.

FIG. 4 is a cross-sectional view schematically illustrating a storage device 100" according to yet some embodiments of the present disclosure. FIG. 4 is approximately taken along line B-B' of FIG. 1. As shown in FIG. 4, the storage device 100" includes a storage unit 100a and a storage unit 100b, in which the storage unit 100a is similar in structure to the storage device 100 depicted in FIG. 2. In some embodiments, the structure of the storage unit 100b is a mirror symmetric to the structure of the storage unit 100a.

The storage device 100" includes a semiconductor substrate 101, a first control gate 110, a second control gate 110", a first word line 120, a second word line 120", a first oxide-nitride-oxide structure 160, and a second oxide-nitride-oxide structure 160".

The semiconductor substrate 101 includes a common source/drain region 102D, a first source/drain region 102S, and a second source/drain region 104D. The first source/drain region 102S and second source/drain region 104D are disposed at opposite sides of the common source/drain region 102D.

The first control gate 110 and the second control gate 110" are arranged at opposite sides of the common source/drain region 102D. Specifically, the first control gate 110 is disposed between the common source/drain region 102D and the first source/drain region 102S. The second control gate 110" is disposed between the common source/drain region 102D and the second source/drain region 104D. In some embodiments, the first control gate 110 and the second control gate 110" may include polycrystalline silicon. It is noted that other conductive materials such as metallic materials may also be employed to form the first control gate 110 and the second control gate 110". When the first control gate 110 and the second control gate 110" are formed of polycrystalline silicon, they may be implanted with an n-type or a p-type impurity, followed by an annealing process to activate the implanted impurity.

The first word line 120 is disposed between the first control gate 110 and the first source/drain region 102S. The second word line 120" is disposed between the second control gate 110" and the second source/drain region 104D. For example, the first word line 120 and second word line 120" may include conductive material such as for example metal, polycrystalline silicon, or the like.

The first oxide-nitride-oxide structure 160 wraps a bottom 111 and sidewalls 112, 113 of the first control gate 110. In some embodiments, the first oxide-nitride-oxide structure 160 includes a first portion 161, a second portion 162, and a third portion 163. The first portion 161 is interposed between the first control gate 110 and the semiconductor substrate 101. The second portion 162 is interposed between the first control gate 110 and the first word line 120. The third portion 163 and the second portion 162 are positioned at opposite sides of the first control gate 110. In some examples, the second portion 162 and/or the third portion 163 extend upwards from opposite edges of the first portion 161. Further, the second portion 162 extends past the top 120T of the word line 120 by a distance D, and the distance D is approximately 10-30% of the height H of the word line 120, specifically approximately 15-25%.

The second oxide-nitride-oxide structure 160" wraps a bottom 114 and sidewalls 115, 116 of the second control gate 110". In some embodiments, the second oxide-nitride-oxide structure 160" includes a first portion 161", a second portion 162", and a third portion 163". The first portion 161" is interposed between the second control gate 110" and the semiconductor substrate 101. The second portion 162" is interposed between the second control gate 110" and the second word line 120". The third portion 163" and the second portion 162" are positioned at opposite sides of the second control gate 110". In some examples, the second portion 162 and/or the third portion 163 extend upwards from opposite edges of the first portion 161. Further, the second portion 162" extends past the top of the second word line 120.

The storage device 100" may optionally include a plurality of spacers 171, 172, 173, 171", 172", 173". The details of the spacers 171, 172, 173, 171", 172", 173" may be the same as or similar to the spacers described hereinbefore in connection with the storage device 100 shown in FIG. 2. In addition, the storage device 100" may optionally include a plurality of silicide layers 181, 182, 183, 182", 183". The details of the silicide layers 181, 182, 183, 182", 183" may be the same as or similar to the silicide layers described hereinbefore in connection with the storage device 100 shown in FIG. 2.

In accordance with one aspect of some embodiments, a storage device includes a semiconductor substrate, a control gate, a word line, a dielectric layer, a charge storage nitride layer, and a blocking layer. The semiconductor substrate has a source region and a drain region. The control gate and a word line are disposed over the semiconductor substrate and located between the source and drain regions. The dielectric layer is in contact with the semiconductor substrate and disposed between the semiconductor substrate, the control gate, and the word line. The charge storage nitride layer is disposed between the dielectric layer and the control gate. The blocking layer is disposed between the charge storage nitride layer and the control gate.

In accordance with another aspect of some embodiments, a storage device includes a semiconductor substrate, a control gate, a word line, and an oxide-nitride-oxide structure. The semiconductor substrate has a source region and a drain region. The control gate and a word line are disposed over the semiconductor substrate and located between the source and drain regions. The oxide-nitride-oxide structure has a first portion interposed between the control gate and the semiconductor substrate and a second portion interposed between the control gate and the word line.

In accordance with another aspect of some embodiments, a storage device includes a semiconductor substrate, a first word line, a second word line, a first control gate, a second control gate, a first oxide-nitride-oxide structure, and a second oxide-nitride-oxide structure. The semiconductor substrate includes a common source/drain region, a first source/drain region, and a second source/drain region, in which the first source/drain region and the second source/drain region are disposed at opposite sides of the common source/drain region. The first control gate is disposed between the common source/drain region and the first source/drain region. The second control gate is disposed between the common source/drain region and the second source/drain region. The first word line is disposed between the first control gate and the first source/drain region. The second word line is disposed between the second control gate and the second source/drain region. The first oxide-nitride-oxide structure wraps a bottom and sidewalls of the first control gate. The second oxide-nitride-oxide structure wraps a bottom and sidewalls of the second control gate.

What is claimed is:

1. A storage device, comprising:
a semiconductor substrate having a source region and a drain region;
a control gate and a word line disposed over the semiconductor substrate and located between the source and drain regions, wherein the semiconductor substrate between the control gate and the word line is free of the source region or the drain region;
a first spacer in contact with a sidewall of the word line;
a silicide in contact with the source region and the first spacer;
an oxide-nitride-oxide structure on a sidewall of the control gate and including:
a dielectric layer;
a charge storage nitride layer disposed between the dielectric layer and the control gate; and
a blocking layer disposed between the charge storage nitride layer and the control gate, and having a top portion over the control gate, wherein the top portion of the blocking layer has a top surface aligned with a top surface of the charge storage nitride layer in a horizontal direction; and
a second spacer on a sidewall of the oxide-nitride-oxide structure, wherein the charge storage nitride layer is between the second spacer and the top portion of the blocking layer,
wherein the dielectric layer, the charge storage nitride layer, and the blocking layer collectively constitute the oxide-nitride-oxide structure that comprises a first portion, a second portion, and a third portion, wherein the second and third portions extend upwards from opposite sides of the first portion, the first portion is under the control gate, and the second and third portions are located at opposite sides of the control gate,
wherein the second and third portions extend past a top of the control gate and a top of the word line, and the second spacer is disposed on the top of the word line and adjoins the second portion of the oxide-nitride-oxide structure.

2. The storage device according to claim 1, wherein the charge storage nitride layer has a width that is greater than a width of the control gate.

3. The storage device according to claim 1, wherein the charge storage nitride layer comprises a first portion, a second portion, and a third portion, wherein the second and third portions of the charge storage nitride layer extend upwards from opposite sides of the first portion of the charge storage nitride layer, the first portion of the charge storage nitride layer is under the control gate, and the second and third portions of the charge storage nitride layer are located at opposite sides of the control gate.

4. The storage device according to claim 3, wherein the second portion of the charge storage nitride layer extends upwards between the control gate and the word line.

5. The storage device according to claim 3, wherein the second and third portions of the charge storage nitride layer extend past a top of the control gate.

6. The storage device according to claim 3, wherein the second and third portions of the charge storage nitride layer extend past the top of the word line.

7. The storage device according to claim 1, wherein the dielectric layer comprises a first portion, a second portion, and a third portion, wherein the first portion of the dielectric layer is interposed between the control gate and the semiconductor substrate, the second portion of the dielectric layer is interposed between the word line and the semiconductor substrate, and the third portion of the dielectric layer is interposed between the control gate and word line.

8. The storage device according to claim 7, wherein the third portion of the dielectric layer has a thickness greater than a thickness of the first portion of the dielectric layer.

9. The storage device according to claim 1, wherein the charge storage nitride layer is interposed between and in direct contact with the dielectric layer and the blocking layer.

10. The storage device according to claim 1, wherein the charge storage nitride layer is interposed between and in direct contact with the dielectric layer and the blocking layer, and the blocking layer is interposed between and in direct contact with the control gate and charge storage nitride layer.

11. The storage device according to claim 10, wherein the blocking layer comprises oxide, and has a thickness that is 20-50% of a thickness of the charge storage nitride layer.

12. The storage device according to claim 10, wherein the dielectric layer comprises oxide, and has a thickness that is 5-30% of a thickness of the charge storage nitride layer.

13. The storage device according to claim 10, wherein the dielectric layer and the blocking layer comprises oxide, and the dielectric layer has a thickness that is 20-70% of a thickness of the blocking layer.

14. The storage device according to claim 1, wherein the word line has a width that is 50-150% of a width of the control gate.

15. A storage device comprising:
a control gate over a substrate;
a word line over the substrate and adjacent to a first side of the control gate;
an oxide-nitride-oxide structure including a dielectric layer and a charge storage nitride layer and between the first side of the control gate and the word line; and a spacer on a side of the oxide-nitride-oxide structure, wherein the spacer has a vertical sidewall aligned with a vertical sidewall of the word line, wherein the dielectric layer, the charge storage nitride layer, and a blocking layer collectively constitute the oxide-nitride-oxide structure that comprises a first portion, a second portion, and a third portion, wherein the second and third portions extend upwards from opposite sides of the first portion, the first portion is under the control gate, and the second and third portions are located at opposite sides of the control gate, wherein the second and third portions extend past a top of the control gate and a top of the word line, and the spacer is disposed on the top of the word line and adjoins the second portion of the oxide-nitride-oxide structure, wherein a top portion of the blocking layer has a top surface aligned with a top surface of the charge storage nitride layer in a horizontal direction.

16. The storage device of claim 15, wherein the dielectric layer and the charge storage nitride layer is further between the control gate and the substrate and the dielectric layer between the control gate and the substrate has a lesser thickness than the charge storage nitride layer between the control gate and the substrate.

17. A storage device comprising:
   a control gate over a substrate and having first and second sidewalls opposite to each other;
   a word line over the substrate and adjacent the first sidewall of the control gate;
   a first spacer adjacent the second sidewall of the control gate;
   an oxide-nitride-oxide structure including a dielectric layer, a charge storage nitride layer, and a blocking layer that are over the substrate, that are between the first spacer and the second sidewall of the control gate, and that are between the first sidewall of control gate and a sidewall of the word line, wherein a top portion of the blocking layer has a top surface aligned with a top surface of the charge storage nitride layer in a horizontal direction; and
   a second spacer on a sidewall of the oxide-nitride-oxide structure, wherein the second spacer and the control gate are separated by the oxide-nitride-oxide structure, wherein the dielectric layer, the charge storage nitride layer, and the blocking layer collectively constitute the oxide-nitride-oxide structure that comprises a first portion, a second portion, and a third portion, wherein the second and third portions extend upwards from opposite sides of the first portion, the first portion is under the control gate, and the second and third portions are located at opposite sides of the control gate, wherein the second and third portions extend past a top of the control gate and the top of the word line, and the second spacer is disposed on the top of the word line and adjoins the second portion of the oxide-nitride-oxide structure.

18. The storage device of claim 17, wherein the word line is in contact with the dielectric layer.

19. The storage device of claim 15, wherein the oxide-nitride-oxide structure is in contact with a bottom of the control gate, the first side of the control gate, and a second side of the control gate opposite to the first side of the control gate.

20. The storage device of claim 15, wherein the spacer has an outer sidewall extending from the top of the word line to a top of the dielectric layer.

* * * * *